(12) United States Patent
Weichmann et al.

(10) Patent No.: US 12,027,819 B2
(45) Date of Patent: Jul. 2, 2024

(54) VERTICAL CAVITY SURFACE EMITTING LASER DEVICE WITH INTEGRATED TUNNEL JUNCTION

(71) Applicant: TRUMPF Photonic Components GmbH, Ulm (DE)

(72) Inventors: Ulrich Weichmann, Ulm (DE); Marcel Franz Christian Schemmann, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 933 days.

(21) Appl. No.: 17/013,920

(22) Filed: Sep. 8, 2020

(65) Prior Publication Data

US 2020/0403376 A1    Dec. 24, 2020

Related U.S. Application Data

(63) Continuation of application No. PCT/EP2019/056571, filed on Mar. 15, 2019.

(30) Foreign Application Priority Data

Mar. 15, 2018 (EP) .................. 18 161 924

(51) Int. Cl.
*H01S 5/183* (2006.01)
*H01S 5/042* (2006.01)
*H01S 5/30* (2006.01)

(52) U.S. Cl.
CPC ........ *H01S 5/18308* (2013.01); *H01S 5/0421* (2013.01); *H01S 5/3095* (2013.01)

(58) Field of Classification Search
CPC .................................................. H01S 5/3095
See application file for complete search history.

(56) References Cited

U.S. PATENT DOCUMENTS 6,490,311 B1 * 12/2002 Boucart .............. H01S 5/18311
                                                                     372/45.01
6,618,410 B1    9/2003 Fischer et al.
(Continued)

FOREIGN PATENT DOCUMENTS

CN      1613170 A    5/2005
EP      0986846 B1   3/2000
(Continued)

OTHER PUBLICATIONS

Translation of JP-2005044964-A attached to original Document (Year: 2005).*

*Primary Examiner* — Minsun O Harvey
*Assistant Examiner* — Stephen Sutton Kotter
(74) *Attorney, Agent, or Firm* — LEYDIG, VOIT & MAYER, LTD.

(57) ABSTRACT

VCSELs have a substrate, first and second electrical contacts (ECs), and an optical resonator (OR), having first and second distributed Bragg reflectors (DBRs) and an active layer between the DBRs. The first DBR is between the substrate and the active layer. One of the DBRs has: first and second parts, having different conductivity types, and each with a pair of layers with different refractive indices. A tunnel junction (TJ) is between the parts. The ECs are for electrically pumping the OR such that the TJ is reversely biased during operation of the VCSEL. Either the first DBR includes the parts, having a relative thickness of the second part to a total thickness of the first and second parts between 0.1-0.8, or the second DBR has the parts, the second part being on the TJ facing away from the active layer, and the relative thickness being between 0.15-0.6.

15 Claims, 8 Drawing Sheets

(56) References Cited

U.S. PATENT DOCUMENTS

| | | | |
|---|---|---|---|
| 6,810,065 B1 | 10/2004 | Naone | |
| 2001/0050934 A1 | 12/2001 | Choquette et al. | |
| 2003/0123513 A1 | 7/2003 | Villareal et al. | |
| 2007/0145388 A1* | 6/2007 | Philippens | H01S 5/18383 257/86 |
| 2007/0153867 A1 | 7/2007 | Muller | |
| 2010/0111125 A1 | 5/2010 | Kondo | |
| 2013/0188659 A1 | 7/2013 | Kondo et al. | |
| 2018/0076598 A1* | 3/2018 | Moench | H01S 5/18358 |
| 2018/0241177 A1* | 8/2018 | Wong | H01S 5/3095 |

FOREIGN PATENT DOCUMENTS

| | | | |
|---|---|---|---|
| EP | 1793462 B1 | | 3/2009 |
| JP | 2005044964 A | * | 2/2005 |
| JP | 2005044964 A | | 2/2005 |
| WO | WO 9807218 A1 | | 2/1998 |
| WO | WO 2016045935 A1 | | 3/2016 |
| WO | WO 2016096647 A1 | | 6/2016 |

* cited by examiner

VERTICAL CAVITY SURFACE EMITTING LASER DEVICE WITH INTEGRATED TUNNEL JUNCTION

CROSS-REFERENCE TO PRIOR APPLICATIONS

This application is a continuation of International Patent Application No. PCT/EP2019/056571, filed on Mar. 15, 2019, which claims priority to European Patent Application No. EP 18161924.8, filed on Mar. 15, 2018. The entire disclosure of both applications is hereby incorporated by reference herein.

FIELD

The present invention relates to a Vertical Cavity Surface Emitting Laser (VCSEL) device with integrated tunnel junction, an optical sensor, and a time-of-flight sensor module comprising such a VCSEL device. The present invention further relates to a corresponding method of fabricating such a VCSEL device.

BACKGROUND

EP 0 986 846 B1 discloses an optoelectronic semiconductor component. The optoelectronic semiconductor component has an active region arranged above a semiconductor substrate between at least one first resonator cavity layer and at least one second resonator cavity layer. The first and second resonator cavity layers are made of a semiconductor material of a first conductivity type. At least one first highly doped transition layer of the first conductivity type and at least one second highly doped transition layer of a second conductivity type are arranged between the active region and one of the two resonator cavity layers, so that the second highly doped, degenerated transition layer lies between the active region and the first highly doped, degenerated transition layer.

JP 2005 044964 A discloses a VCSEL comprising a substrate, an upper distributed Bragg reflector and a lower distributed Bragg reflector. Within the upper distributed Bragg reflector, a tunnel junction is arranged.

US 2013/0188659 A1 discloses a VCSEL comprising an upper distributed Bragg reflector of a first conductivity type, an active region, and a lower distributed Bragg reflector of a second conductivity type. A tunnel junction is arranged in the upper distributed Bragg reflector.

US 2001/0050934 A1 discloses a VCSEL comprising an upper distributed Bragg reflector, an active region and a lower distributed Bragg reflector. A tunnel junction is arranged between the upper distributed Bragg reflector and an oxide aperture layer.

SUMMARY

In an embodiment, the present invention provides A Vertical Cavity Surface Emitting Laser device that has a substrate; a first electrical contact; a second electrical contact; and an optical resonator. The optical resonator has: a first distributed Bragg reflector; a second distributed Bragg reflector; and an active layer for light emission. The active layer is between the first distributed Bragg reflector and the second distributed Bragg reflector. The first distributed Bragg reflector is between the substrate and the active layer. Either the first distributed Bragg reflector or the second distributed Bragg reflector has: a first part with at least one pair of layers with different refractive indices; and a second part with at least one pair of layers with different refractive indices. The first part and the second part are characterized by different conductivity types. A tunnel junction is between the first part and the second part. The first electrical contact and the second electrical contact are configured to electrically pump the optical resonator such that the tunnel junction is reversely biased during operation of the Vertical Cavity Surface Emitting Laser device. Either, the first distributed Bragg reflector includes the first part and the second part, wherein a relative thickness of the second part with respect to a total thickness of the first part and the second part of the first distributed Bragg reflector is between 0.1-0.8, or the second distributed Bragg reflector includes the first part and the second part, the second part being arranged on a side of the tunnel junction facing away from the active layer, wherein the relative thickness of the second part with respect to the total thickness of the first part and the second part of the second distributed Bragg reflector is between 0.15-0.6.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
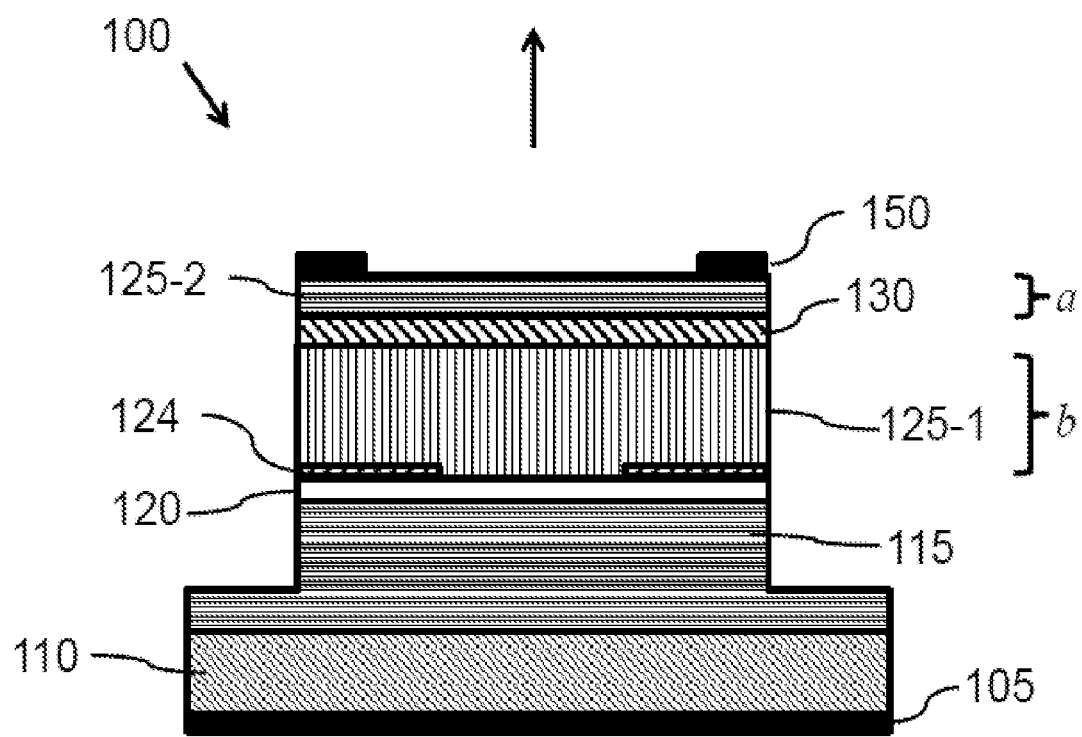
FIG. 1 shows a first VCSEL device with integrated tunnel junction.

Embodiments of the present invention provide an improved Vertical Cavity Surface Emitting Laser device with an integrated tunnel diode.

According to a first aspect, a Vertical Cavity Surface Emitting Laser (VCSEL) device is provided. The VCSEL device comprises a substrate, a first electrical contact, a second electrical contact and an optical resonator. The optical resonator comprises a first distributed Bragg reflector (DBR), a second DBR, and an active layer for light emission. The active layer is arranged between the first DBR and the second DBR, and the first distributed Bragg reflector is arranged between the substrate and the active layer. Either the first DBR or the second DBR comprises a first part with at least one pair of layers with different refractive indices and a second part with at least one pair of layers with different refractive indices. The first part and the second part are characterized by different conductivity types (n-conductivity or p-conductivity). A tunnel junction is arranged between the first part and the second part. The first electrical contact and the second electrical contact are arranged to electrically pump the optical resonator such that the tunnel junction is reversely biased during operation of the VCSEL device. One of the following alternatives holds:

a) the first distributed Bragg reflector comprises the first part and the second part (115-2), wherein the relative thickness of the second part with respect to the total thickness of the first part and the second part of the first distributed Bragg reflector is between 0.1-0.8; b) the second distributed Bragg reflector comprises the first part and the second part, the second part being arranged on a side of the tunnel junction facing away from the active layer (120), wherein the relative thickness of the second part with respect to the total thickness of the first part and the second part of the second distributed Bragg reflector is between 0.15-0.6.

The VCSEL device may comprise a current confinement layer for concentrating an electrical current to a defined region of the active layer during operation of the VCSEL. The VCSEL device may further comprise additional layers like buffer layers, current distribution layers etc. The first part and the second part contribute to the reflectivity of the respective DBR. Each layer of the pair of layers with different refractive indices of the respective DBR is characterized by a thickness of a quarter of the emission wavelength of the VCSEL device within the material of the respective layer. Each of the layers may comprise sub layers. The active layer may, for example, comprise a quantum well structure comprising a multitude of sub layers. The VCSEL device may be arranged to emit laser light in the wavelength range between 750 and 2000 nm.

The tunnel junction consists typically of two highly-doped, thin GaAs-layers, one of the first conductivity type (e.g. n-doped) and one of the different second conductivity type (e.g. p-doped). The thickness of each layer of the tunnel junction is typically in the range 10-60 nm and doping levels should be as high as possible. Typical values for the doping levels are above $10^{19}$ cm$^{-3}$. The tunnel junction may preferably be optimized for lowest resistance and losses independently from the reflectivity of the respective DBR. It may therefore be necessary to provide buffer layers to adapt the phase of the optical wave within the respective DBR. Total optical thickness of the tunnel junction and corresponding buffer layer or layers may, for example be half of the wavelength or integer multiples thereof. Alternatively, the tunnel junction with buffer layer(s) may have an optical thickness of a quarter wavelength or 2n+1 multiples thereof with n=1, 2, 3 . . . and may be one layer or one pair of layers of the respective DBR.

Due to the availability of high-quality substrates at reasonable costs, VCSELs or VCSEL devices are commonly grown on n-type substrates so that the structured top-side of the VCSEL is the anode, while the usually un-structured and common substrate contact is the cathode. The structured anode requires modulation of the anode voltage imposing a burden on the design of the electrical driver of the VCSEL device. The tunnel junction enables transfer of the cathode to the structured contacts of the VCSEL device. Modulation of the cathode voltage is desirable in applications where shortened high current pulses are applied to a VCSEL device or an array of VCSELs (e.g. time-of-flight LIDAR). Complex simulations have shown that integration of the tunnel junction in one of the DBRs can reduce optical absorption up to a factor of 5. Furthermore, the current density at the position of the tunnel junction by choosing the right position within the DBR could be reduced significantly such that electrical losses caused by the tunnel junction can be avoided or are at least at an acceptable level.

The first part of the respective DBR may be arranged on a side of the tunnel junction facing the active layer (e.g. sandwiched between the active laser and the tunnel junction). The second part is arranged on a side of the tunnel junction, which is turned away from the active layer such that first part is arranged between the active layer and the tunnel junction, and wherein the tunnel junction is arranged between the first part and the second part. A relative thickness of the second part with respect to the total thickness of the first part and the second part of the respective first or second DBR is between 0.1 and 0.8.

The layers of the tunnel junction may be arranged in a node of a standing wave pattern within the optical resonator during operation of the Vertical Cavity Surface Emitting Laser device. The position in the node or near to a node of the standing wave pattern reduces the optical absorption, which may be caused by the high doping level of the layers of the tunnel junction. The thickness of the tunnel junction (total thickness of highly doped p-layer and highly doped n-layer) may, therefore, be as thin as possible. The thickness of the tunnel junction may, therefore, be less than a quarter of the emission wavelength in the respective material (e.g. GaAs), more preferably less than 50 nm and most preferably less than 40 nm. The tunnel junction is preferably thicker than 20 nm to avoid excessive electrical losses, which may outweigh the optical advantage. The second part of the respective DBR may comprise between 1-25 pairs of layers with different refractive indices, more preferably between 3-20 pairs of layers with different refractive indices and most preferably between 5-15 pairs of layers with different refractive indices.

The VCSEL device may comprise a current confinement layer as indicated above. The first part is arranged in-between the current confinement layer and the tunnel junction. The current confinement layer provides a further separation of the respective DBR. The pair of layers of the respective DBR, which are arranged between the current confinement layer and the active layer are a third part, which is not comprised by the first part because the distance between the current confinement layer and the tunnel junction determines the current density in the tunnel junction and therefore the related electrical losses. The tunnel junction and the current confinement layer may be separated by between 2 and 25 pairs of layers with different refractive indices. The number of pairs of layers may depend on intermediate spacer layers (e.g. GaAs bulk layer). There may be at least 5, more preferably at least 9 and even more preferred more than 15 pairs of layers between the tunnel junction and the current confinement layer. The pairs of layers are layers of the respective DBR. The current confinement layer may, for example, be an oxide aperture, a phototransistor or any other layer structure, which is arranged to confine the electrical current provided by means of the first and the second electrode to a predefined area or region of the active layer. The distance between the tunnel junction and the current confinement layer avoids or at least reduces high current densities and corresponding electrical losses at the tunnel junction during operation of the VCSEL device.

The VCSEL device comprises a substrate. The first DBR is arranged between the substrate and the active layer. The substrate may be a growth substrate (e.g. gallium arsenide substrate) on which the functional layers of the VCSEL device are deposited during processing of the VCSEL device.

The second DBR may comprise the first part and the second part. The relative thickness of the second part with respect to the total thickness of the first part and the second part of the second DBR is between 0.15-0.6, preferably between 0.2-0.5. The second part of the second DBR may comprise between 2-10 pairs of layers with different refractive indices, more preferably between 2-8 pairs of layers with different refractive indices.

The substrate may be characterized by a first conductivity type. The first DBR is in this embodiment characterized by the same first conductivity type. The first part of the second DBR is characterized by a second conductivity type. The second part of the second DBR is characterized by the first conductivity type.

The first distributed Bragg reflector may, in an alternative embodiment, comprise the first part and the second part. The relative thickness of the second part with respect to the total thickness of the first part and the second part of the first distributed Bragg reflector is in this embodiment between 0.1-0.8, preferably between 0.2-0.6. The second part of the second DBR may comprise between 3-30 pairs of layers with different refractive indices, more preferably between 7-22 pairs of layers with different refractive indices.

The substrate may, in this embodiment, be characterized by a first conductivity type. The first part of the first DBR is characterized by a second conductivity type, wherein the second part of the first DBR next to the substrate is characterized by the first conductivity type. The second DBR is characterized by the first conductivity type.

The first conductivity type may be n-conductive. The second electrical contact is in this embodiment arranged on the side of the second DBR turned away from the active layer. The second electrical contact is arranged to be a cathode contact of the VCSEL device. The substrate is in this embodiment an n-type substrate (e.g. n-doped gallium arsenide substrate). The tunnel junction enables in this case use of the structured second electrical contact as cathode contact as discussed above. The latter may especially be useful in case of VCSEL devices comprising a multitude of VCSELs (VCSEL array).

A reflectivity of the second DBR may, in one embodiment, be lower than a reflectivity of the first DBR, such that laser light is emitted through the second DBR during operation of the VCSEL device. The second electrical contact comprises in this case an opening (e.g. ring contact) such that the laser light is emitted through the opening of the second electrical contact. The VCSEL device is in this case a so-called top emitter.

A reflectivity of the second DBR may be higher than a reflectivity of the first DBR, in an alternative embodiment, such that laser light is emitted through the first DBR during operation of the VCSEL device. The VCSEL device is in this case a so-called bottom emitter. The (usually common first electrical contact in case of a VCSEL array) is structured such that the laser light can be emitted through openings in the first electrical contact. The substrate may be completely removed or at least locally removed to reduce optical losses caused by the substrate. The VCSEL device may alternatively be arranged to emit the laser light through the substrate. Emission wavelength of the VCSEL device may be above 850 nm in this case to reduce optical losses in case of a gallium arsenide substrate.

The VCSEL device according to any embodiment described above may be comprised by an optical sensor. The optical sensor may be comprised by a mobile communication device. The optical sensor may be used for distance detection, velocity detection, and/or gesture control.

A time-of-flight sensor module may comprise at least one VCSEL device according to any embodiment as discussed above. The time-of-flight sensor module further comprises an electrical driver arranged to provide the current between the first electrical contact and the second electrical contact. The time-of-flight sensor module may be comprised by a mobile communication device.

According to a further aspect, a method of fabricating a VCSEL device with integrated tunnel junction is provided. The method comprises the steps of:
  providing a substrate,
  providing a first electrical contact,
  providing a first DBR,
  providing an active layer such that the first DBR is arranged between the active layer and the substrate,
  providing a second DBR such that the active layer is arranged between the first DBR and the second DBR,
  providing a tunnel junction such that the first DBR is separated in a first part comprising at least one pair of layers with different refractive indices and a second part comprising at least one pair of layers with different refractive indices, wherein the first part and the second part are characterized by different conductivity types, wherein the relative thickness of the second part with respect to the total thickness of the first part and the second part of the first distributed Bragg reflector is between 0.1-0.8, and
  providing a second electrical contact, wherein the first electrical contact and the second electrical contact are arranged to provide an electrical drive current to electrically pump the VCSEL device.

According to a further aspect, a method of fabricating a Vertical Cavity Surface Emitting Laser device, the method comprises the steps of:
  providing a substrate,
  providing a first electrical contact,
  providing a first distributed Bragg reflector,
  providing an active layer such that the first distributed Bragg reflector is arranged between the active layer and the substrate,
  providing a second distributed Bragg reflector such that the active layer is arranged between the first distributed Bragg reflector and the second distributed Bragg reflector,
  providing a tunnel junction such that the second distributed Bragg reflector is separated in a first part comprising at least one pair of layers with different refractive indices and a second part comprising at least one pair of layers with different refractive indices, wherein the first part and the second part are characterized by different conductivity types, wherein the second part is arranged on a side of the tunnel junction facing away from the active layer, wherein the relative thickness of the second part with respect to the total thickness of the first part and the second part of the second distributed Bragg reflector is between 0.15-0.6, and
  providing a second electrical contact, wherein the first electrical contact and the second electrical contact are arranged to provide an electrical drive current to electrically pump the Vertical Cavity Surface Emitting Laser device.

The steps in both methods need not be performed in the order given above. The different layers may be deposited by epitaxial methods, like MOCVD (metal organic chemical vapor deposition), MBE (molecular beam epitaxy), and the like. The substrate may be removed in a subsequent processing step. The first electrode may in this case be arranged between the substrate and the first DBR. The first electrode may alternatively be provided after removing the substrate.

It shall be understood that the VCSEL device according to any embodiment described above and the method of fabricating the VCSEL device have similar and/or identical embodiments, in particular, as defined in the description provided above and below.

Further advantageous embodiments are defined below.

These and other aspects of the invention will be apparent from and elucidated with reference to the embodiments described hereinafter.

The invention will now be described, by way of example, based on embodiments with reference to the accompanying drawings.

In the Figures, like numbers refer to like objects throughout. Objects in the Figures are not necessarily drawn to scale.

FIG. 1 shows a principal sketch of a first VCSEL device 100 with integrated tunnel junction 130. The VCSEL device 100 is a top emitting VCSEL.

A first electrical contact 105 is arranged on a first side of a gallium arsenide substrate 110 (e.g. n-type substrate 110). A first DBR 115 is deposited on a second side of the substrate 110, which is opposite to the first side of the substrate 110. Intermediate layers like buffer layers may be arranged between the substrate 115 and the first DBR 115. The first DBR comprises 30 pairs of quarter wavelength GaAs layers and AlGaAs layers with different refractive indices. An active layer 120 is arranged on top of the first DBR 115. The active layer 120 is in this embodiment a quantum well structure comprising several sub layers.

A first part of the second DBR 125-1 is arranged on a side of the active layer 120 opposite to the side of the active layer 120 next to the first DBR 115. The active layer 120 is in this embodiment sandwiched between the first DBR 115 and the first part of the second DBR 125-1. A thickness of the first part of the second DBR 125-1 is given by b.

A current confinement layer 124 is integrated at the end of the first part of the first DBR such that the distance between the current confinement layer 124 and the tunnel junction is 130 essentially given by b. There may be a matching layer arranged between the active layer 120 and the current confinement layer 124. The current confinement layer 124 is an oxide aperture consisting of a partly oxidized AlAs-layer or AlGaAs-layer with low Ga-content.

A tunnel junction 130 is arranged on top of the first part of the second DBR 125-1. The tunnel junction 130 comprises a 20 nm highly n-doped layer and a 20 nm highly p-doped GaAs layer. The sequence of the conductivity type of the tunnel junction is adapted to the conductivity types of the substrate and the DBR or parts of the respective DBR.

An intermediate GaAs matching layer is arranged next to the tunnel junction 130. The matching layer has a thickness of 109 nm such that the total thickness of the tunnel junction 130 and the matching layer is 144 nm (thickness of λ/2 at an emission wavelength of 980 nm). The tunnel junction 130 and the corresponding matching layer are arranged between the first part of the second DBR 125-1 and a second part of the second DBR 125-2. The second part of the second DBR 125-2 comprises 4 pairs of GaAs/AlGaAs layers of altogether 19 pairs of layers comprised by the second DBR. A thickness of the second part of the second DBR 125-2 is given by a. A relative thickness of the second part of the second DBR 125-2 with respect to the total thickness of the first and the second part of the second DBR 125-1, 125-2 is given by the ratio a/(a+b).

A ring shaped second electrical contact 150 is placed on top of the second part of the second DBR 125-2. A current distribution layer may be arranged between the second part of the second DBR 125-2 and the second electrical contact 150. Laser light (indicated by the arrow) with an emission wavelength of 980 nm is emitted through the opening in the second electrical contact 150 during operation of the VCSEL device 100.

Figure 2:
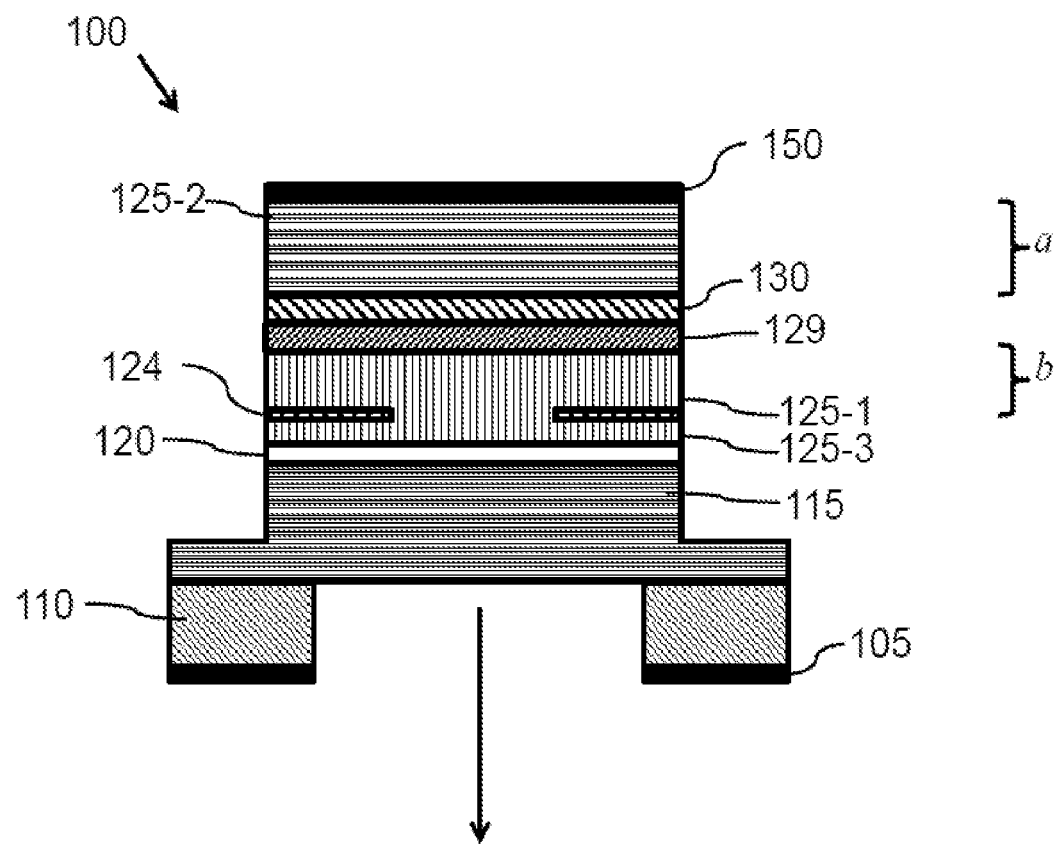
FIG. 2 shows a second VCSEL device with integrated tunnel junction.

FIG. 2 shows a principal sketch of a second VCSEL device 100 with integrated tunnel junction 130. The second VCSEL device 100 is a bottom emitting VCSEL.

The first DBR 115, the active layer 120, the current confinement layer 124, the first part of the second DBR 125-1, the tunnel junction 130, the second part of the second DBR 125-2 and the second electrical contact 150 are arranged on a substrate 110 in the same sequence as described with respect to FIG. 1.

A thickness of the tunnel junction 130 consisting of two highly doped GaAs layers is 35 nm. The second DBR comprises a first part 125-1 with 18 pairs of layers of different refractive indices and the second part 125-2 comprises 16 pairs of layers with different refractive indices. An intermediate GaAs matching layer 129 (may comprise several sublayers) is arranged next to the tunnel junction 130 to match the phase of the first and second part of the second DBR 125-1, 125-2 at the emission wavelength of 808 nm. Longer emission wavelengths (>900 nm) may be preferred in view of the absorption losses at emission wavelengths lower than 900 nm in the tunnel junction (comprises doped GaAs layers).

The current confinement layer 124 is an oxide aperture, which is arranged between the active layer 120 and the tunnel junction 130. The oxide aperture further separates the second DBR. A third part 125-3 of the second DBR is arranged between the active layer 120 and the oxide layer. The third part 125-3 is not relevant with respect to the current density in the tunnel junction and therefore the related electrical losses. A thickness b of the first part 125-1 of the first DBR is given by the distance between the oxide aperture and the tunnel junction 130. The part of the first DBR, which is arranged between the oxide aperture and the active layer 120 is not comprised by the first part 125-1 of the first DBR.

The second electrical contact 150 covers the second part of the second DBR 125-2 completely. The first electrical contact 105 is arranged on a side of the substrate 110, which is opposite to the side of the substrate 110 on which the functional semiconductor layers of the VCSEL device 100 are deposited. A part of the first electrical contact 105 and the substrate 110 are removed such that laser light with the emission wavelength of 800 nm is emitted via the 20 pairs of layers of different refractive indices of the first DBR 115.

Figure 3:
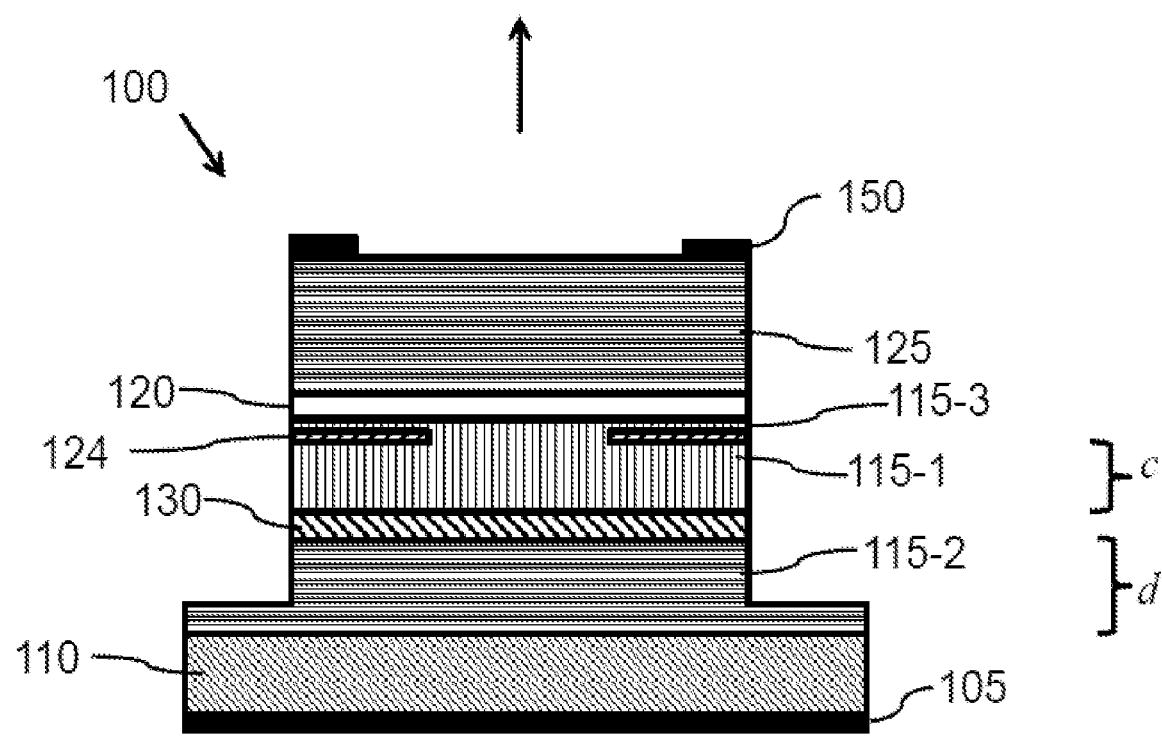
FIG. 3 shows a third VCSEL device with integrated tunnel junction.

FIG. 3 shows a principal sketch of a third VCSEL device 100 with integrated tunnel junction 130. The third VCSEL device 100 is a top emitting VCSEL similar as discussed with respect to FIG. 1.

The tunnel junction 130 is, in this case, integrated in the first DBR, which comprises a first part 115-1 and a second part 115-2. A current confinement layer 124 is integrated in the first part of the first DBR 115-1 near to the active layer 120 to provide a higher current density in the active layer 120. The current confinement layer 124 is again an oxide aperture, which is arranged in the p-doped part of the first DBR to enable in view of high electron mobility sufficient current confinement. The oxide aperture further separates the first DBR.

A third part 115-3 of the first DBR is arranged between the active layer 120 and the oxide layer. The third part 115-3 is not relevant with respect to the current density in the tunnel junction and therefore the related electrical losses. The tunnel junction 130 comprises in this case two highly doped layers (one n-doped and one p-doped) with a total thickness of 40 nm.

An intermediate GaAs matching layer or layers are arranged next to the tunnel junction 130 to match the phase of the first and second part of the first DBR 115-1, 115-2. The pn junction of the tunnel junction 130 is arranged in a node of a standing wave pattern of the third VCSEL device 100 to reduce optical losses, which may be caused by the highly doped layers.

Two additional matching layers similar as discussed with respect to FIG. 1 are provided above and below the tunnel junction 130 such that the total thickness of the tunnel junction 130 together with the matching layers is one emission wavelength of the third VCSEL device 100. A relative thickness of the second part of the first DBR 115-2 is given by the ratio d/(c+d), wherein d is the thickness of the second part of the first DBR 115-2 and c is the thickness of the first part of the first DBR 115-1.

The second DBR 125 comprises 19 pairs of layers with different refractive indices. The first DBR comprises 35 pairs of layers with different refractive indices, wherein the second part of the first DBR 115-2 comprises 18 pairs of layers with different refractive indices.

Figure 4:
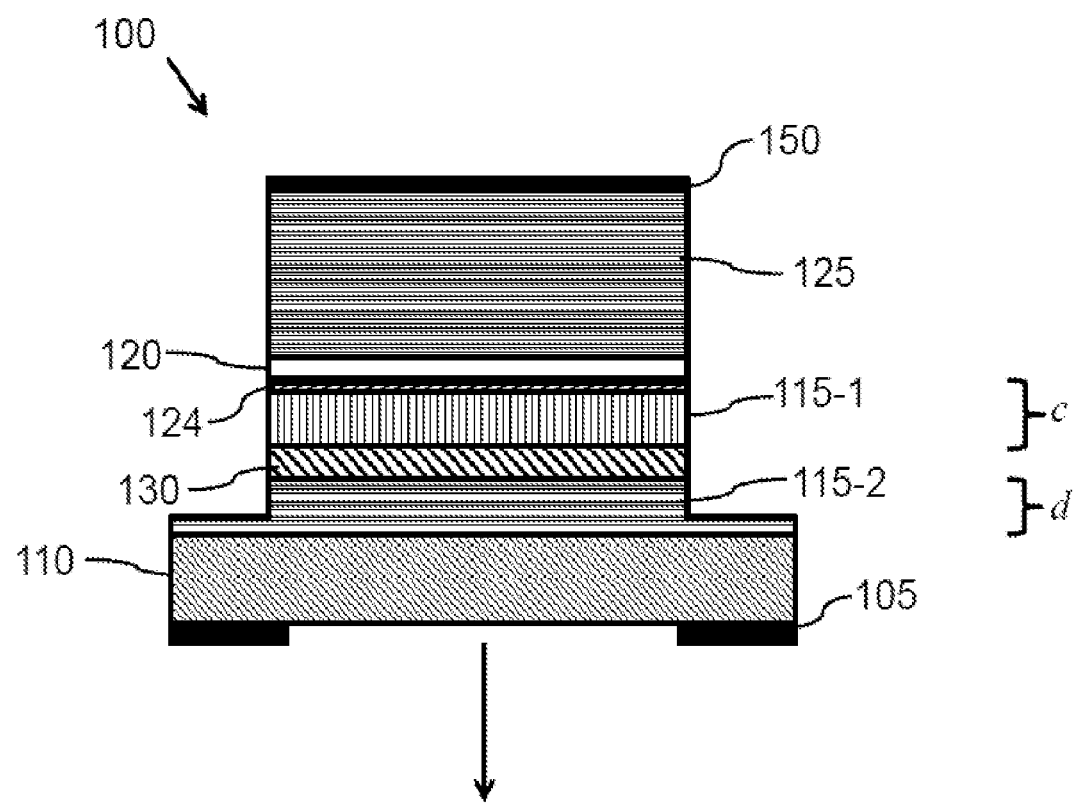
FIG. 4 shows a fourth VCSEL device with integrated tunnel junction.

FIG. 4 shows a principal sketch of a fourth VCSEL device 100 with integrated tunnel junction 130. The general configuration is similar as discussed with respect to FIG. 3. The fourth VCSEL device 100 is a bottom emitter, which is arranged to emit laser light with an emission wavelength of 940 nm through the GaAs substrate 110.

The first electrical contact 105 comprises an opening at the emission area of the fourth VCSEL device 100. The tunnel junction 130 is again embedded in the first DBR. A current confinement layer 124 is embedded between the first part of the first DBR 115-1 and the active layer 120 such that 15 pairs of layers with different refractive indices are arranged between the tunnel junction 130 and the current confinement layer 124. The current confinement layer 124 is a phototransistor as described, for example, in WO 2016/045935 A1 which is incorporated by reference. The first DBR comprises 19 pairs of layers with different refractive indices and the second DBR 125 comprises 42 pairs of layers with different refractive indices.

The VCSEL devices 100 discussed with respect to FIGS. 1-4 comprise one VCSEL. Alternative embodiments of VCSEL devices 100 may comprise two, three, four or more VCSELs arranged on a common substrate. The VCSELs may be arranged in a linear or a two-dimensional array.

Figure 5:
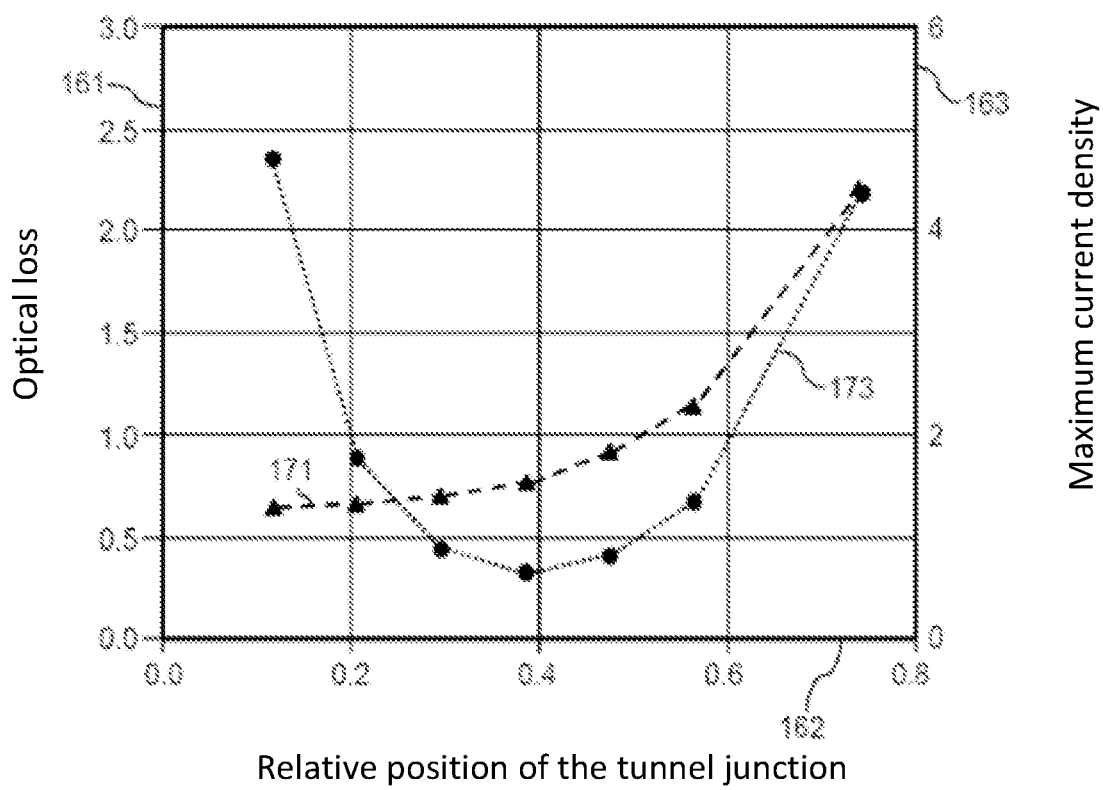
FIG. 5 shows optimization of a position of the tunnel junction within a second DBR.

FIG. 5 shows an optimization of a position of the tunnel junction 130 within a second DBR. The second DBR would be the p-doped DBR in case of a standard VCSEL (grown on an n-type substrate 110) without tunnel junction.

The configuration that is used for the simulation is essentially the same as discussed with respect to FIG. 1. Boundary condition of the simulations is that the substrate is an n-type substrate, which is commercially available at reasonable costs and high quality.

The x-axis 162 describes the relative position of the tunnel junction in the respective DBR (second DBR). The x-axis corresponds to the parameter a/(a+b) discussed above. A small value means a position close to the uppermost layer of the second DBR (cap layer) and a large value means a position close to the active layer 120 of the VCSEL device 100 or more precisely close to the current confinement layer 124. The left axis 161 shows the normalized optical losses to compare a VCSEL device 100 with tunnel junction 130 with the total optical loss of a standard VCSEL without tunnel junction 130.

Line 171 shows the optical losses as a function of the relative position in the second DBR. The total optical loss of the VCSEL drops for positions of the tunnel junction close to the uppermost layer of the second DBR. From that point of view, it would be highly desirable to place the tunnel junction 130 as close to the uppermost layer of the second DBR as possible.

On the other hand, the right axis 163 shows the maximum current density in the tunnel junction 130. Line 173 shows the maximum current density in the tunnel junction 130 for different positions of the tunnel junction 130 in the second DBR of the VCSEL device 100.

A high current density in the tunnel junction causes a high voltage drop and related high electrical losses. It is therefore highly desirable to keep the current density in the tunnel-junction as low as possible.

Taking optical as well as electrical aspects into account, the preferred position of the tunnel junction 130 within the second DBR of the VCSEL device 100 is therefore at relative positions a/(a+b) (see FIG. 1) between 0.15 and 0.6, more preferably between 0.2 and 0.5.

Figure 6:
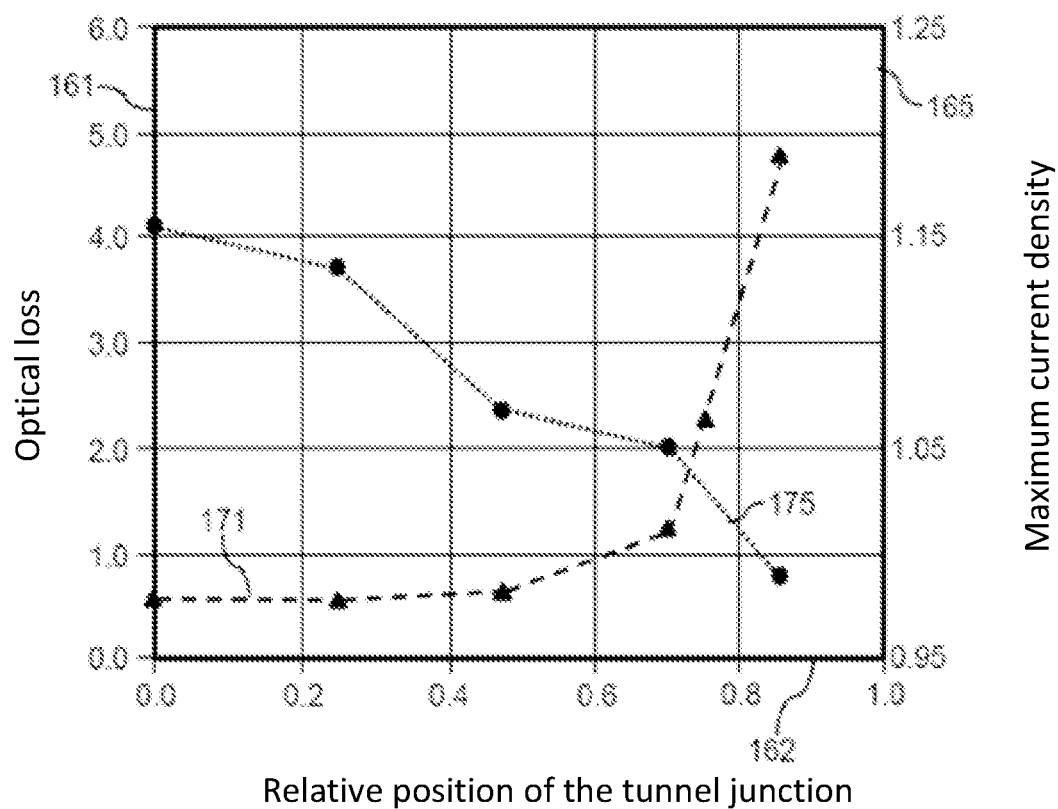
FIG. 6 shows optimization of a position of the tunnel junction within a first DBR.

FIG. 6 shows optimization of a position of the tunnel junction within a first DBR. The first DBR would be the n-doped DBR in case of a standard VCSEL (grown on an n-type substrate 110) without tunnel junction.

The configuration, which is used for the simulation, is essentially the same as discussed with respect to FIG. 3. Boundary condition of the simulations is again that the substrate is an n-type substrate as discussed with respect to FIG. 5.

The x-axis 162 describes again the relative position of the tunnel junction in the respective DBR (first DBR). The x-axis corresponds to the parameter d/(c+d) discussed above. A small value means a position close to the substrate and a large value means a position close to the active layer 120 of the VCSEL device 100 or more precisely close to the current confinement layer 124 which mainly determines the current density.

The left axis 161 shows again the normalized optical losses to compare a VCSEL device 100 with tunnel junction 130 with the total optical loss of a standard VCSEL without tunnel junction 130. Line 171 shows the optical losses as a function of the relative position in the first DBR. The total optical loss of the VCSEL drops for positions of the tunnel junction 130 within the first DBR close to the substrate 110.

Similar as discussed with respect to FIG. 5 it would therefore be highly desirable to place the tunnel junction 130 as close to the substrate 110 as possible to reduce optical losses in comparison to a VCSEL without tunnel junction 130. The best position may in this respect be between the substrate 110 and the first DBR to avoid disturbance of the reflective properties of the first DBR, which may be caused by the integration of the tunnel junction 130.

The right axis 165 shows the electrical resistance of the VCSEL with integrated tunnel junction 130 relative to a VCSEL without tunnel junction 130. Line 175 shows the dependence of the ratio of the electrical resistances as a function of the relative position within the first DBR.

The simulations show that the highly desirable position next to the substrate 110 with respect to the optical losses suffers from an increased electrical resistance in comparison to the standard VCSEL without tunnel junction 130. From the electrical point of view, a placement of the tunnel junction 130 close to the active layer 120 is preferred. Like in the case of a placement of the tunnel junction in the second DBR, there is an optimum position at intermediate positions.

Taking optical as well as electrical aspects into account, the preferred position of the tunnel junction 130 within the first DBR of the VCSEL device 100 is therefore at relative positions d/(c+d) (see FIG. 3) between 0.1 and 0.8, more preferably between 0.2 and 0.6.

Figure 7:
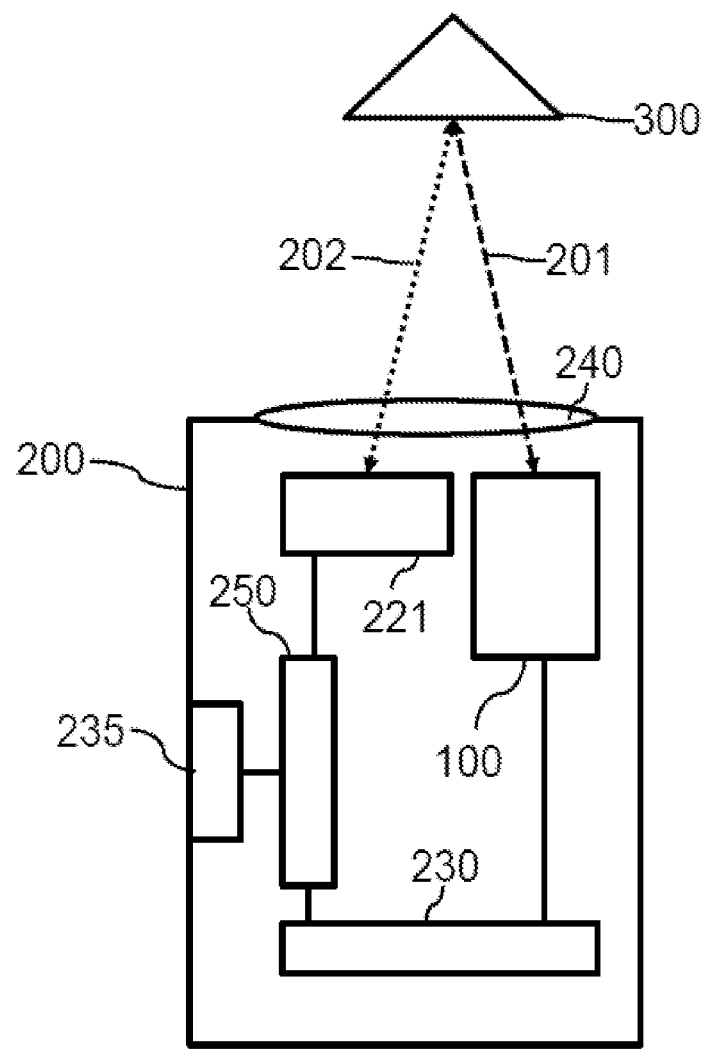
FIG. 7 shows a principal sketch of a time-of-flight sensor module.

FIG. 7 shows a principal sketch of a time-of-flight sensor module 200.

The time-of-flight sensor module 200 comprises a VCSEL device 100, which comprises a two-dimensional VCSEL array. The time-of-flight sensor module 200 further comprises a detector 221, which is arranged to detect very short light pulses. Such short laser pulses may be caused by laser light 201 emitted by the VCSEL device 100 hitting an object 300.

A part of the emitted laser light 201 is reflected by the object 300 such that reflected laser light 202 is received by detector 221. The reflected laser light 202 causes a corresponding electrical signal in the detector 221.

An electrical driver 230 is arranged to electrically drive the VCSEL device 100. A controller 250 is connected with the electrical driver 230 to control, for example, start and stop time of the laser pulses emitted by VCSEL device 100. The controller 250 is further connected with the detector 221 to receive the electrical signals caused by the reflected laser light 202 detected by detector 221.

The time-of-flight sensor module 200 further comprises an optional interface 235 to transfer start and stop time of the emitted laser light 201 as well as time of reception of the electrical signals caused by the reflected laser light 202. The transferred data can be used to calculate the time-of-flight of the laser light and therefore distances between the time-of-flight sensor module 200 and the object 300.

The time-of-flight sensor module 200 may alternatively comprise an evaluator electrically connected with the controller 250 (or the evaluator may comprise controller 250) to determine distances to the object. Several distance measurements may be used to determine a velocity or even an acceleration of the object 300.

Figure 8:
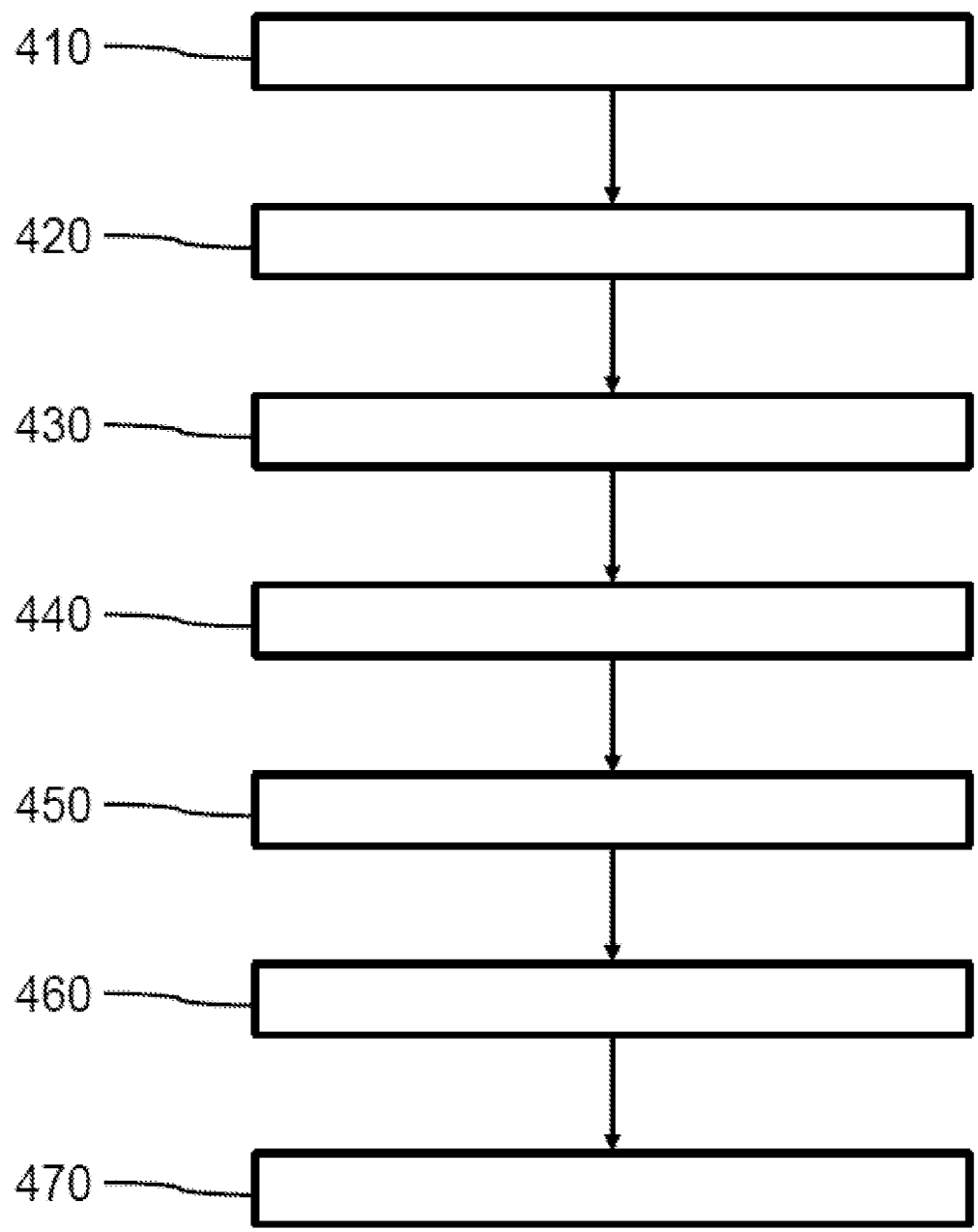
FIG. 8 shows a process flow of a method of fabricating a VCSEL device.

FIG. 8 shows a principal sketch of a process flow of a method of fabricating a VCSEL according to the present invention.

A substrate 110 is provided in step 410. A first electrical contact 105 is provided in step 420. In step 430 a first distributed Bragg reflector 115 is provided. An active layer 120 is provided in step 440 such that the first distributed Bragg reflector 115 is arranged between the active layer 120 and the substrate 110. A second distributed Bragg reflector 125 is provided in step 450 such that the active layer 120 is arranged between the first distributed Bragg reflector 115 and the second distributed Bragg reflector 125. A tunnel junction 130 is provided in step 460. The tunnel junction 130 is either integrated in the first distributed Bragg reflector 115 or the second distributed Bragg reflector 125. The tunnel junction 130 separates the first distributed Bragg reflector 115 or the second distributed Bragg reflector 125 in a first part 115-1, 125-1 and a second part 115-2, 125-2. The first part 115-1, 125-1 comprises at least one pair of layers with different refractive indices. The second part 115-2, 125-2 comprises at least one pair of layers with different refractive indices. The first part 115-1, 125-1 and the second part 115-2, 125-2 are characterized by different conductivity types. A second electrical contact 150 is provided in step 470. The first electrical contact 105 and the second electrical contact 150 are arranged to provide an electrical drive current to electrically pump the VCSEL device such that the tunnel junction is reversely biased during operation of the VCSEL device.

The layers of the first DBR, the active layer and any other layer as current injection layers and the like may be deposited by epitaxial methods like MOCVD or MBE.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

100 VCSEL device
105 first electrical contact 110 substrate
115 first DBR
115-1 first part of first DBR
115-2 second part of the first DBR
115-3 third part of the first DBR
120 active layer
124 current confinement layer
125 second DBR
125-1 first part of second DBR
125-2 second part of second DBR
125-3 third part of the second DBR
129 matching layer
130 tunnel junction
150 second electrical electrode
161 optical loss relative to standard VCSEL
162 relative position of tunnel junction in DBR
163 maximum current density in tunnel junction [kA/cm$^2$]
165 electrical resistance relative to standard VCSEL
171 optical losses as function of relative position in DBR
173 maximum current density as function of relative position in DBR
175 electrical resistance as function of relative position in DBR
200 time-of-flight sensor module
201 emitted laser light
202 reflected laser light
221 detector
230 electrical driver
235 interface
240 optical device
250 controller
300 object
410 step of providing a substrate
420 step of providing a first electrical contact
430 step of providing a first distributed Bragg reflector
440 step of providing an active layer
450 step of providing a second distributed Bragg reflector
460 step of providing a tunnel junction
470 step of providing a second electrical contact

The invention claimed is:

1. A Vertical Cavity Surface Emitting Laser device comprising:
a substrate;
a first electrical contact;
a second electrical contact; and
an optical resonator, wherein the optical resonator comprises:
a first distributed Bragg reflector as a first end mirror of the optical resonator;
a second distributed Bragg reflector as a second end mirror of the optical resonator; and
an active layer for light emission,
wherein the active layer is between the first distributed Bragg reflector and the second distributed Bragg reflector,
wherein the first distributed Bragg reflector is between the substrate and the active layer,
wherein either the first distributed Bragg reflector or the second distributed Bragg reflector comprises:
a first part with at least one pair of layers with different refractive indices; and
a second part with at least one pair of layers with different refractive indices,
wherein the first part and the second part are characterized by different conductivity types,
wherein a tunnel junction is between the first part and the second part,
wherein the first electrical contact and the second electrical contact are configured to electrically pump the optical resonator such that the tunnel junction is reversely biased during operation of the Vertical Cavity Surface Emitting Laser device, and
wherein either:
a) the first distributed Bragg reflector comprises the first part and the second part, wherein a relative thickness of the second part with respect to a total thickness of the first part and the second part of the first distributed Bragg reflector is between 0.1-0.8, or
b) the second distributed Bragg reflector comprises the first part and the second part, the second part being arranged on a side of the tunnel junction facing away from the active layer, wherein the relative thickness of the second part with respect to the total thickness of the first part and the second part of the second distributed Bragg reflector is 0.2 and 0.5.

2. The Vertical Cavity Surface Emitting Laser device according to claim 1, wherein the first distributed Brag reflector comprises the first part and the second part, the first part is arranged on a side of the tunnel junction facing the active layer, wherein the second part is arranged on the side of the tunnel junction facing away from the active layer, and wherein the relative thickness of the second part with respect to the total thickness of the first part and the second part of the first distributed Bragg reflector is between 0.1 and 0.8.

3. The Vertical Cavity Surface Emitting Laser device according to claim 1, wherein the tunnel junction is configured to be arranged in a node of a standing wave pattern within the optical resonator during operation of the Vertical Cavity Surface Emitting Laser device.

4. The Vertical Cavity Surface Emitting Laser device according to claim 1, wherein the Vertical Cavity Surface Emitting Laser device comprises a current confinement layer, wherein the first part is arranged between the current confinement layer and the tunnel junction.

5. The Vertical Cavity Surface Emitting Laser device according to claim 1,
wherein the second distributed Bragg reflector comprises the first part and the second part, the second part being arranged on the side of the tunnel junction facing away from the active layer, and
wherein the relative thickness of the second part with respect to the total thickness of the first part and the second part of the second distributed Bragg reflector is 0.2-0.5.

6. The Vertical Cavity Surface Emitting Laser device according to claim 1,
wherein the second distributed Bragg reflector comprises the first part and the second part, the second part being arranged on the side of the tunnel junction facing away from the active layer,
wherein the relative thickness of the second part with respect to the total thickness of the first part and the second part of the second distributed Bragg reflector is between 0.2 and 0.5,
wherein the substrate is characterized by a first conductivity type,
wherein the first distributed Bragg reflector is characterized by the first conductivity type,
wherein the first part of the second distributed Bragg reflector is characterized by a second conductivity type, and wherein the second part of the second distributed Bragg reflector is characterized by the first conductivity type.

7. The Vertical Cavity Surface Emitting Laser device according to claim 1,
wherein the first distributed Bragg reflector comprises the first part and the second part, and
wherein the relative thickness of the second part of the first distributed Bragg reflector with respect to the total thickness of the first part and the second part of the first distributed Bragg reflector is between 0.2-0.6.

8. The Vertical Cavity Surface Emitting Laser device according to claim 1,
wherein the first distributed Bragg reflector comprises the first part and the second part, and
wherein the relative thickness of the second part with respect to the total thickness of the first part and the second part of the first distributed Bragg reflector is between 0.1-0.8,
wherein the substrate is characterized by a first conductivity type,
wherein the first part of the first distributed Bragg reflector is characterized by a second conductivity type,
wherein the second part of the first distributed Bragg reflector is characterized by the first conductivity type, and
wherein the second distributed Bragg reflector is characterized by the first conductivity type.

9. The Vertical Cavity Surface Emitting Laser device according to claim 6,
wherein the first conductivity type is n-conductive,
wherein the second electrical contact is arranged on the side of the second distributed Bragg reflector facing away from the active layer, and
wherein the second electrical contact is configured to be a cathode contact of the Vertical Cavity Surface Emitting Laser device.

10. The Vertical Cavity Surface Emitting Laser device according to claim 1, wherein a reflectivity of the second distributed Bragg reflector is lower than a reflectivity of the first distributed Bragg reflector such that laser light is configured to be emitted through the second distributed Bragg reflector during operation of the Vertical Cavity Surface Emitting Laser device.

11. The Vertical Cavity Surface Emitting Laser device according to claim 1, wherein a reflectivity of the second distributed Bragg reflector is higher than a reflectivity of the first distributed Bragg reflector such that laser light is configured to be emitted through the first distributed Bragg reflector during operation of the Vertical Cavity Surface Emitting Laser device.

12. An optical sensor comprising the Vertical Cavity Surface Emitting Laser device according to claim 1.

13. A time-of-flight sensor module comprising at least one of the Vertical Cavity Surface Emitting Laser device according to claim 1, wherein the time-of-flight sensor module further comprises an electrical driver arranged to provide the current between the first electrical contact and the second electrical contact.

14. A method of fabricating a Vertical Cavity Surface Emitting Laser (VCSEL) device, the method comprising:
providing a substrate;
providing a first electrical contact;
providing a first distributed Bragg reflector as a first end mirror of an optical resonator of the VCSEL device;
providing an active layer such that the first distributed Bragg reflector is arranged between the active layer and the substrate;
providing a second distributed Bragg reflector as a second end mirror of the optical resonator of the VCSEL device, wherein the active layer is arranged between the first distributed Bragg reflector and the second distributed Bragg reflector;
providing a tunnel junction such that the first distributed Bragg reflector is separated in a first part, comprising at least one pair of layers with different refractive indices, and a second part, comprising at least one pair of layers with different refractive indices, wherein the first part and the second part are characterized by different conductivity types, wherein the relative thickness of the second part with respect to the total thickness of the first part and the second part of the first distributed Bragg reflector is between 0.1-0.8; and
providing a second electrical contact, wherein the first electrical contact and the second electrical contact are arranged to provide an electrical drive current to electrically pump the Vertical Cavity Surface Emitting Laser device.

15. A method of fabricating a Vertical Cavity Surface Emitting Laser (VCSEL) device, the method comprising:
providing a substrate;
providing a first electrical contact;
providing a first distributed Bragg reflector as a first end mirror of an optical resonator of the VCSEL device;
providing an active layer such that the first distributed Bragg reflector is arranged between the active layer and the substrate;
providing a second distributed Bragg reflector as a second end mirror of the optical resonator of the VCSEL device, wherein the active layer is arranged between the first distributed Bragg reflector and the second distributed Bragg reflector;
providing a tunnel junction such that the second distributed Bragg reflector is separated in a first part, comprising at least one pair of layers with different refractive indices, and a second part, comprising at least one pair of layers with different refractive indices, wherein the first part and the second part are characterized by different conductivity types, wherein the second part is arranged on a side of the tunnel junction facing away from the active layer, wherein a relative thickness of the second part with respect to a total thickness of the first part and the second part of the second distributed Bragg reflector is between 0.2 and 0.5, and
providing a second electrical contact, wherein the first electrical contact and the second electrical contact are arranged to provide an electrical drive current to electrically pump the Vertical Cavity Surface Emitting Laser device.

* * * * *